(12) United States Patent
Waechter et al.

(10) Patent No.: US 11,280,025 B2
(45) Date of Patent: Mar. 22, 2022

(54) VAPOR PHASE EPITAXY METHOD

(71) Applicant: AZUR SPACE SOLAR POWER GMBH, Heilbronn (DE)

(72) Inventors: Clemens Waechter, Lauffen am Neckar (DE); Gregor Keller, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/129,720

(22) Filed: Dec. 21, 2020

(65) Prior Publication Data

US 2021/0189592 A1    Jun. 24, 2021

(30) Foreign Application Priority Data

Dec. 20, 2019    (DE) ..................... 10 2019 008 928.6

(51) Int. Cl.
*C30B 25/08*    (2006.01)
*C30B 25/10*    (2006.01)
(Continued)

(52) U.S. Cl.
CPC .............. *C30B 25/08* (2013.01); *C30B 25/10* (2013.01); *C30B 25/165* (2013.01); *C30B 29/42* (2013.01); *H01L 21/0262* (2013.01)

(58) Field of Classification Search
CPC ......... C30B 25/02; C30B 29/42; C30B 29/40; C30B 25/10; C30B 25/165; C30B 29/403;
(Continued)

(56) References Cited

U.S. PATENT DOCUMENTS 5,824,151 A    10/1998 Ohkubo
7,229,498 B2 *  6/2007 Norman .................. C30B 25/02
                                                         117/102
(Continued)

FOREIGN PATENT DOCUMENTS

JP    H 09-312264 A    12/1997
JP     H 10-29897 A     2/1998
(Continued)

OTHER PUBLICATIONS

German Search Report for German Application No. 10 2019 008 928.6 dated Aug. 3, 2020 with English translation.

*Primary Examiner* — Jaehwan Oh
(74) *Attorney, Agent, or Firm* — Muncy, Geissler, Olds & Lowe, P.C.

(57) ABSTRACT

A vapor phase epitaxy method including: providing a III-V substrate of a first conductivity type, introducing the III-V substrate into a reaction chamber of a vapor phase epitaxy system at a loading temperature, heating the III-V substrate from the loading temperature to an epitaxy temperature while introducing an initial gas flow, depositing a III-V layer with a dopant concentration of a dopant of the first conductivity type on a surface of the III-V substrate from the vapor phase from an epitaxial gas flow, fed into the reaction chamber and comprising the carrier gas, the first precursor, and at least one second precursor for an element of main group III, wherein during the heating from the loading temperature to the epitaxy temperature, a third precursor for a dopant of the first conductivity type is added to the initial gas flow.

15 Claims, 1 Drawing Sheet

(51) Int. Cl.
*C30B 25/16* (2006.01)
*C30B 29/42* (2006.01)
*H01L 21/02* (2006.01)

(58) Field of Classification Search
CPC .......... H01L 21/02395; H01L 21/0262; H01L 21/02463; H01L 21/0254; H01L 21/02543; H01L 21/02546; H01L 29/36
See application file for complete search history.

(56) References Cited

U.S. PATENT DOCUMENTS

| | | | |
|---|---|---|---|
| 9,824,890 | B2 | 11/2017 | Young et al. |
| 9,834,860 | B2 * | 12/2017 | Washington ...... H01L 21/02395 |
| 2009/0149008 | A1 * | 6/2009 | Kryliouk ............... C23C 16/303 |
| | | | 438/503 |
| 2011/0083601 | A1 * | 4/2011 | Washington ........ H01L 21/0254 |
| | | | 117/104 |
| 2018/0019117 | A1 * | 1/2018 | Washington ............ C30B 29/40 |

FOREIGN PATENT DOCUMENTS

| | | | |
|---|---|---|---|
| JP | 2015-20708 | A | 10/2001 |
| JP | 4377968 | B2 | 9/2009 |

* cited by examiner

VAPOR PHASE EPITAXY METHOD

This nonprovisional application claims priority under 35 U.S.C. § 119(a) to German Patent Application No. 10 2019 008 928.6, which was filed in Germany on Dec. 20, 2019, and which is herein incorporated by reference.

BACKGROUND OF THE INVENTION

Field of the Invention

The present invention relates to a vapor phase epitaxy method

Description of the Background Art

The most diverse vapor phase epitaxy systems, e.g., from the company Aixtron, for the epitaxial formation of semiconductor layers are known.

It is typically a common feature of the method that a reaction chamber for introducing a substrate is opened, then closed, pumped out, and sufficiently heated in order then to bring about growth of semiconductor layers on a surface of the substrate by a gas flow introduced into the reaction chamber.

The composition of the gas flow depends on the type of layer to be grown, wherein typically precursors, such as arsine and/or TMGa, supply the elements for the semiconductor layer to be grown and, if necessary, precursors for a dopant are also added for doping the layer.

SUMMARY OF THE INVENTION

It is therefore an object of the present invention to provide a method that refines the state of the art.

According to an exemplary embodiment of the invention, a vapor phase epitaxy method is provided which has the following method steps: providing a III-V substrate of a first conductivity type; introducing the III-V substrate into a reaction chamber of a vapor phase epitaxy system at a loading temperature $T_B$; heating the III-V substrate from the loading temperature $T_B$ to an epitaxy temperature $T_E$ while introducing an initial gas flow comprising a carrier gas and a first precursor for a first element from main group V; and depositing a III-V layer with a dopant concentration of a dopant of the first conductivity type on a surface of the III-V substrate from the vapor phase from an epitaxial gas flow, fed into the reaction chamber and comprising the carrier gas, the first precursor, and at least one second precursor for an element of main group III.

In addition, during the heating from the loading temperature $T_B$ to the epitaxy temperature $T_E$, a third precursor for a dopant of the first conductivity type is added at least intermittently to the initial gas flow. The third precursor is preferably added during the entire heating process.

It is understood that a III-V substrate has at least one component of main group III and at least one component of main group V. The substrate consists, for example, of GaAs.

The temperature at which the reaction chamber is opened and the substrate is placed in the chamber is referred to as the loading temperature. It is understood that the loading temperature is based on the loading technique. Thus, the loading temperature for a manual loading typically has to be significantly lower than for loading by robot. Epitaxial growth typically does not yet occur at the loading temperature.

The epitaxy temperature refers to the temperature that is selected for the growth process and ensures reliable growth.

It is understood that crystal growth can also be possible at higher and lower temperatures or within a temperature window.

Molecules that serve as the starting product for epitaxial growth are called precursors. A precursor is accordingly a molecule consisting of an element to be grown, e.g., an element of main group III or V, and at least one further element.

For example, $H_2$ or $N_2$ is suitable as a carrier gas for the gas flows.

The initial gas flow with the carrier gas and the precursor for a first element from main group V, e.g., arsine, is introduced into the reaction chamber during the heating process to prevent the diffusion of a corresponding element of main group V, e.g., arsenic, out of the III-V substrate. This is also referred to as stabilizing the layers, therefore, substrate surfaces.

The further addition of a dopant of the first conductivity type or a corresponding third precursor to the initial gas flow prevents an, albeit thin, layer, doped with the second conductivity type, from forming on the substrate surface during the heating process.

Dopants of the second conductivity type and/or elements of main group III are present or deposited as background/contamination in the reaction chamber, for example, due to previous uses of the epitaxy system.

The deposited elements and dopants evaporate due to the heating. Together with the arsine, i.e., evaporation from the surface of the semiconductor wafer, an undesirable growth of a possibly very thin layer can already occur during the heating process.

The lower the III-V layer to be grown is to be doped, the more relevant is the influence of such an unwanted layer doped with the second conductivity type, namely a further blocking effect in the forward direction initially for higher voltage values as well.

Particularly in the case of components with low-doped layers for a high dielectric strength, the method of the invention therefore results in the characteristic curve of the components reliably deviating at most slightly from an ideal characteristic curve in the forward direction as well.

The addition of the third precursor can begin during the heating below a temperature of 500° C. or below a temperature of 400° C. or below a temperature of 300° C. This ensures that no epitaxial growth can take place before the third precursor is added.

The addition of the third precursor can begin during the heating starting from a temperature of at least 150° C. or at least starting from a temperature of 200° C.

A total mass flow of the initial gas flow can be at most 10% of a total mass flow of the epitaxial gas flow.

A planetary reactor can be used as the reaction chamber.

In a refinement, a III-V substrate with a dopant concentration of at least $1 \cdot 10^{17}$ cm$^{-3}$ or at least $10^{18}$ cm$^{-3}$ can be provided.

According to a refinement, the III-V layer can be grown with a dopant concentration decreasing from $10^{18}$ cm$^{-3}$ to $10^{15}$ cm$^{-3}$.

According to another refinement, the III-V layer is grown with a dopant concentration decreasing from $10^{17}$ cm$^{-3}$ or $5 \cdot 10^{16}$ cm$^{-3}$ to $10^{15}$ cm$^{-3}$. In one embodiment, the initial doping of the III-V layer is in a range between the substrate doping down to $5 \cdot 10^{16}$ cm$^{-3}$.

The III-V layer can be grown with a layer thickness of at most 10 μm or at most 30 μm or at most 60 μm.

The III-V layer can have a layer thickness of at least 10 µm or at least 30 µm. The III-V layer preferably has a layer thickness in a range between 10 µm and 60 µm.

The first conductivity type can be p or n.

The III-V layer can be grown firmly bonded on the surface of the III-V substrate.

The dopant concentration within the III-V layer can be set by means of a ratio of a mass flow of the first precursor to a mass flow of the second precursor and/or by means of a mass flow, added to the epitaxial gas flow, of the third precursor.

The doping of a III-V layer when using suitable dopants, e.g., carbon, also depends on the ratio between the element of main group III and the element of main group V.

The dopant in this regard can be provided in the form of a further precursor for a corresponding dopant, e.g., carbon tetrabromide, or by means of an organometallic precursor, for example, the second precursor for the element of main group III, e.g., TMGa.

If a precursor for a dopant is added, this is referred to as active doping, whereas doping by means of the carbon of an organometallic precursor is referred to as autodoping.

According to a further example, the third precursor is dimethylzinc or diethylzinc or carbon tetrabromide or 1,2-bis(cyclopentadienyl)magnesium or monosilane or disilane or dimethyl telluride or diethyl telluride or diisopropyl telluride.

The substrate can have a constant dopant concentration over a layer thickness or a dopant concentration that changes by at most 1% or a dopant concentration that changes by at most 10%.

In an example, the III-V substrate comprises or consists of GaAs.

According to an example, the epitaxy temperature $T_E$ is at least 550° C. or at least 600° C. and at most 900° C.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
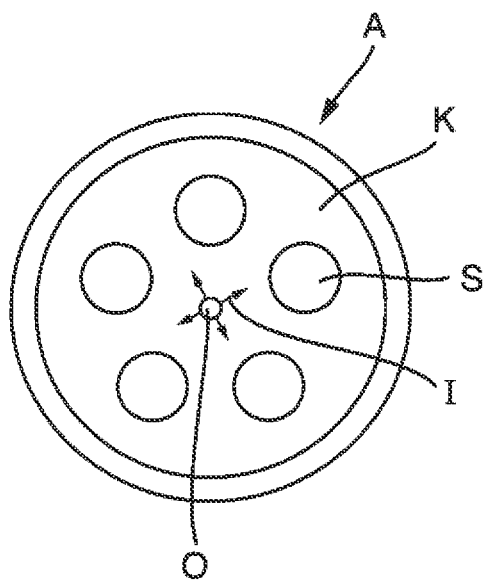
FIG. 1 shows a plan view of substrates arranged in a reaction chamber during a heating process.

The illustration in FIG. 1 shows a sectional view from above of a reactor chamber K, designed as a planetary reactor, of a vapor phase epitaxy system A with a number of III-V substrates arranged therein and a gas inlet member O through which an epitaxial gas flow is introduced into the reactor chamber K to deposit a III-V layer.

The epitaxial gas flow has at least one carrier gas, a first precursor for an element of main group V, and a second precursor for an element of main group III.

After reactor chamber K is loaded at a loading temperature $T_B$, the reactor chamber is closed, pumped out, and heated.

During the heating of the reactor chamber, an initial gas flow I is fed into reactor chamber K through gas inlet member O.

Figure 2:
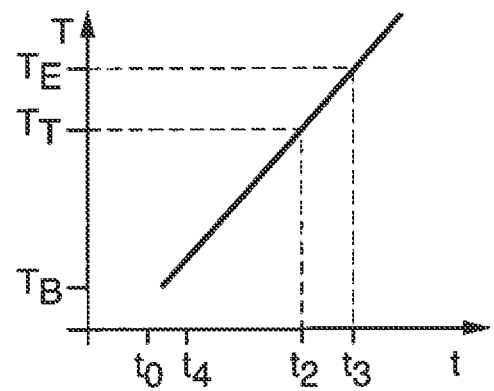
FIG. 2 shows a temperature profile of a first embodiment of the invention of a heating process.

The heating follows, for example, the temperature profile shown in the illustration in FIG. 2, wherein the initial gas flow I at a point in time t0 at the loading temperature $T_B$ comprises the carrier gas and a first precursor for an element of main group V.

A third precursor for a dopant of the first conductivity type is added to the initial gas flow starting when a trigger temperature $T_T$ is reached at a point in time t2 and until an epitaxy temperature $T_E$ is reached.

It is understood that the trigger temperature $T_T$ is less than the epitaxy temperature $T_E$ and time $t_2$ lies before time $t_3$. The trigger temperature $T_T$ is, for example, 500° C. or 400° C.

Alternatively, the trigger temperature $T_T$ corresponds to the loading temperature $T_B$, so that the third precursor is already present in the initial gas flow I from the point in time $t_2$-$t_0$, therefore, from the beginning.

It should be noted for the sake of completeness that a gas flow prior to loading is not possible in terms of safety.

Figure 3:
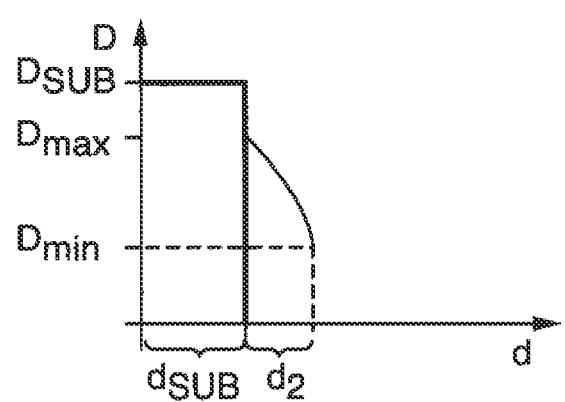
FIG. 3 shows a dopant concentration profile over a III-V substrate and a subsequent III-V layer.

The illustration in FIG. 3 shows a profile of a dopant concentration of the first conductivity type D over a thickness d of the III-V substrate and the III-V layer. The III-V substrate provided has a constant dopant concentration $D_{SUB}$ of the first conductivity type over a thickness $d_{SUB}$.

By adding the third precursor during the heating, the doping of the III-V layer grown on the III-V substrate S begins directly following the III-V substrate S with a dopant concentration $D_{max}$ of the first conductivity type. The dopant concentration decreases up to a dopant concentration $D_{min}$ over a layer thickness $d_L$ of the III-V layer.

Figure 4:
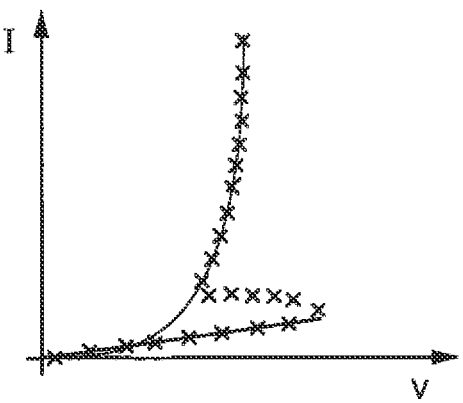
FIG. 4 shows profiles of characteristic curves.

Due to the dopant concentration profile achieved by the method of the invention, a diode characteristic following the ideal profile results for a component (diode) supplemented by a layer of the second conductivity type in the forward direction; this is shown by way of example as a solid line in the illustration in FIG. 4.

Without the addition of the third precursor during heating, a thin undesirable layer, i.e., an intermediate layer, of the second conductivity type can form possibly between the substrate of the first conductivity type and the layer of the first conductivity type grown in the subsequent deposition step.

Such a layer of the second conductivity type for a component (diode) supplemented by a further layer of the second conductivity type results in an extended blocking in the forward direction and a corresponding returning characteristic curve, as illustrated by the profile represented by crosses in the figure in FIG. 4.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vapor phase epitaxy method comprising:
   providing a III-V substrate of a first conductivity type;
   introducing the III-V substrate into a reaction chamber of a vapor phase epitaxy system at a loading temperature;
   heating the III-V substrate from the loading temperature to an epitaxy temperature while introducing an initial gas flow comprising a carrier gas and a first precursor for a first element from main group V;
   depositing a III-V layer with a dopant concentration of a dopant of the first conductivity type on a surface of the III-V substrate from the vapor phase from an epitaxial gas flow, fed into the reaction chamber and comprising the carrier gas, the first precursor, and at least one second precursor for an element of main group III; and
   adding, during the heating from the loading temperature to the epitaxy temperature, a third precursor for a dopant of the first conductivity type to the initial gas flow.

2. The vapor phase epitaxy method according to claim 1, wherein the addition of the third precursor begins during the heating below a temperature of 500° C. or below a temperature of 400° C. or below a temperature of 300° C.

3. The vapor phase epitaxy method according to claim 1, wherein a total mass flow of the initial gas flow is at most 10% of a total mass flow of the epitaxial gas flow.

4. The vapor phase epitaxy method according to claim 1, wherein a planetary reactor is used as the reaction chamber.

5. The vapor phase epitaxy method according to claim 1, wherein a III-V substrate with a dopant concentration of at least $1 \cdot 10^{17}$ cm$^{-3}$ or at least $1 \cdot 10^{18}$ cm$^{-3}$ is provided.

6. The vapor phase epitaxy method according to claim 1, wherein the III-V layer is grown with a dopant concentration decreasing from $10^{17}$ cm$^{-3}$ to $10^{15}$ cm$^{-3}$.

7. The vapor phase epitaxy method according to claim 1, wherein the III-V layer is grown with a layer thickness of at most 30 μm.

8. The vapor phase epitaxy method according to claim 1, wherein the first conductivity type is p or n.

9. The vapor phase epitaxy method according to claim 1, wherein the III-V layer is grown firmly bonded on the surface of the III-V substrate.

10. The vapor phase epitaxy method according to claim 1, wherein the dopant concentration within the III-V layer is set by a ratio of a mass flow of the first precursor to a mass flow of the second precursor and/or by a mass flow, added to the epitaxial gas flow, of the third precursor.

11. The vapor phase epitaxy method according to claim 1, wherein the third precursor is dimethylzinc or diethylzinc or carbon tetrabromide or 1,2-bis(cyclopentadienyl)magnesium or monosilane or disilane or dimethyl telluride or diethyl telluride or diisopropyl telluride.

12. The vapor phase epitaxy method according to claim 1, wherein the III-V substrate has a constant dopant concentration over a layer thickness or a dopant concentration that changes by at most 1%.

13. The vapor phase epitaxy method according to claim 1, wherein the III-V substrate comprises or consists of GaAs.

14. The vapor phase epitaxy method according to claim 1, wherein the epitaxy temperature is at least 550° C. or at least 600° C. and at most 900° C.

15. The vapor phase epitaxy method according to claim 1, wherein the addition of the third precursor begins during the heating starting from a temperature of at least 150° C. or least starting from a temperature of 200° C.

* * * * *